United States Patent
Sung et al.

(10) Patent No.: US 10,971,651 B2
(45) Date of Patent: Apr. 6, 2021

(54) SEMICONDUCTOR DEVICE AND SEMICONDUCTOR DEVICE PACKAGE INCLUDING SAME

(71) Applicant: LG INNOTEK CO., LTD., Seoul (KR)

(72) Inventors: Youn Joon Sung, Seoul (KR); Min Sung Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/479,065

(22) PCT Filed: Jan. 19, 2018

(86) PCT No.: PCT/KR2018/000911
§ 371 (c)(1),
(2) Date: Jul. 18, 2019

(87) PCT Pub. No.: WO2018/135908
PCT Pub. Date: Jul. 26, 2018

(65) Prior Publication Data
US 2020/0013925 A1 Jan. 9, 2020

(30) Foreign Application Priority Data
Jan. 20, 2017 (KR) .................. 10-2017-0009992

(51) Int. Cl.
*H01L 33/26* (2010.01)
*H01L 33/08* (2010.01)
(Continued)

(52) U.S. Cl.
CPC .............. *H01L 33/26* (2013.01); *H01L 33/08* (2013.01); *H01L 33/14* (2013.01); *H01L 33/36* (2013.01)

(58) Field of Classification Search
CPC .......... H01L 33/26; H01L 33/08; H01L 33/14; H01L 33/36
(Continued)

(56) References Cited

U.S. PATENT DOCUMENTS

2004/0149996 A1* 8/2004 Hsieh .................. H01L 33/0093
257/88
2005/0077528 A1* 4/2005 Liu ........................ H01L 33/405
257/79
(Continued)

FOREIGN PATENT DOCUMENTS

KR  10-2013-0019233  2/2013
KR  10-2014-0003351  1/2014
(Continued)

OTHER PUBLICATIONS

English Machine Translation of Korean Patent Publication KR 2016/0027644. (Year: 2016).*
(Continued)

*Primary Examiner* — Dzung Tran
(74) *Attorney, Agent, or Firm* — KED & Associates LLP

(57) ABSTRACT

Disclosed is in the embodiment is a semiconductor device comprising: a first conductive semiconductor layer; a second conductive semiconductor layer; an active layer disposed between the second conductive semiconductor layer and the second conductive semiconductor layer; a first electrode electrically connected to the first conductive semiconductor layer; and a second electrode electrically connected to the second conductive semiconductor layer, wherein the first conductive semiconductor layer includes a first sub semiconductor layer, a third sub semiconductor layer and a second sub semiconductor layer disposed between the first sub semiconductor layer and the third sub semiconductor layer, wherein proportion of aluminum in the first sub semiconductor layer and the third sub semiconductor layer
(Continued)

is larger than an proportion of aluminum in the active layer, and an proportion of aluminum in the second sub semiconductor layer is smaller than the proportion of aluminum in the first sub semiconductor layer and the third sub semiconductor layer, wherein the second conductive semiconductor layer includes a current injection layer of which proportion of aluminum decreases as a distance from the active layer increases, the first electrode is disposed on the second sub semiconductor layer, the second electrode is disposed on the current injection layer, and the ratio of the average value of the proportion of aluminum in the second sub semiconductor layer to the average value of the proportion of aluminum in the current injection layer is 1:0.12 to 1:1.6.

9 Claims, 7 Drawing Sheets

(51) Int. Cl.
 *H01L 33/14* (2010.01)
 *H01L 33/36* (2010.01)
(58) Field of Classification Search
 USPC .......................................................... 257/103
 See application file for complete search history.

(56) References Cited

U.S. PATENT DOCUMENTS

| | | | |
|---|---|---|---|
| 2006/0118802 A1* | 6/2006 | Lee | H01L 33/22 |
| | | | 257/98 |
| 2008/0258174 A1* | 10/2008 | Seong | H01L 33/42 |
| | | | 257/184 |
| 2010/0096657 A1* | 4/2010 | Ou | H01L 33/24 |
| | | | 257/98 |
| 2011/0108798 A1 | 5/2011 | Song | |
| 2012/0292631 A1 | 11/2012 | Katsuno et al. | |
| 2014/0138613 A1* | 5/2014 | Kim | H01L 33/22 |
| | | | 257/13 |
| 2014/0291690 A1 | 10/2014 | Yi et al. | |

FOREIGN PATENT DOCUMENTS

| | | |
|---|---|---|
| KR | 10-2016-0019799 | 2/2016 |
| KR | 10-2016-0027644 | 3/2016 |
| WO | WO 2009/131401 | 10/2009 |

OTHER PUBLICATIONS

International Search Report (with English Translation) and Written Opinion dated Apr. 24, 2018 issued in Application No. PCT/KR2018/000911.

* cited by examiner

SEMICONDUCTOR DEVICE AND SEMICONDUCTOR DEVICE PACKAGE INCLUDING SAME

CROSS-REFERENCE TO RELATED PATENT APPLICATIONS

This application is a U.S. National Stage Application under 35 U.S.C. § 371 of PCT Application No. PCT/KR2018/000911, filed Jan. 19, 2018, which claims priority to Korean Patent Application No. 10-2017-0009992, filed Jan. 20, 2017, whose entire disclosures are hereby incorporated by reference.

TECHNICAL FIELD

The present invention relates to a semiconductor device and a semiconductor device package including the same.

BACKGROUND ART

Since semiconductor devices including compounds, such as GaN and AlGaN, have many advantages in that energy band gaps are wide and easy to adjust, the semiconductor devices can be variously used for light-emitting devices, light receiving devices, various diodes, and the like.

Particularly, the light-emitting devices such as light-emitting diodes and laser diodes using III-V or II-VI compound semiconductor materials can express various colors such as red, green, and blue and emit ultraviolet light as thin film growth technologies and device materials are developed, can emit high efficiency white light when phosphors are used or colors are mixed, and have advantages in low power consumption, semi-permanent lifespan, quick response time, safety, and eco-friendliness when compared to conventional light sources such as fluorescent tubes and incandescent lamps.

In addition, when the light receiving devices such as a photodetector or a solar cell are manufactured using III-V or II-VI compound semiconductor materials, since the light receiving devices absorb light in various wavelength ranges to generate a photocurrent due to developed device materials, light in various wavelength ranges from a gamma ray range to a radio frequency range can be used. In addition, the light receiving devices can be easily used for power control, microwave circuits, or communication modules due to their advantages in quick response time, safety, eco-friendliness, and easy adjustment of the device materials.

Therefore, applications of the semiconductor devices are being widened to receiving modules of optical communications, light-emitting diode backlights substituting for cold cathode fluorescence lamps (CCFL) forming backlights of liquid crystal display (LCD) devices, white light-emitting diode lighting devices substituting for fluorescent tubes and incandescent lamps, vehicle head lights, traffic lights, and sensors configured to detect gas or fire. In addition, applications of the semiconductor devices can be widened to high frequency application circuits, other power control apparatuses, and communication modules.

Particularly, an ultraviolet light-emitting device can perform a curing or sterilizing action and can be used for curing, medical, and sterilizing purposes. In addition, the ultraviolet light-emitting device can be used for a gas sensor because exhaust gas of a vehicle absorbs light having a wavelength of 230 nm.

However, there is a problem in that ohmic properties are degraded because a proportion of aluminum increases to generate light in the ultraviolet wavelength band.

DISCLOSURE

Technical Problem

The present invention is directed to providing a light-emitting device with improved ohmic properties.

Objectives to be solved by embodiments are not limited to the above-described objective and will include objectives and effects which can be identified by solutions for the objectives and the embodiments described below.

Technical Solution

One aspect of the present invention provides a semiconductor device including a first conductive semiconductor layer, a second conductive semiconductor layer, an active layer disposed between the second conductive semiconductor layer and the second conductive semiconductor layer, a first electrode electrically connected to the first conductive semiconductor layer, and a second electrode electrically connected to the second conductive semiconductor layer, wherein the first conductive semiconductor layer includes a first sub semiconductor layer, a third sub semiconductor layer, and a second sub semiconductor layer disposed between the first sub semiconductor layer and the third sub semiconductor layer, each of a proportion of aluminum in the first sub semiconductor layer and a proportion of aluminum in the third sub semiconductor layer is greater than a proportion of aluminum in the active layer, a proportion of aluminum in the second sub semiconductor layer is less than each of the proportion of aluminum in the first sub semiconductor layer and the proportion of aluminum in the third sub semiconductor layer, the second conductive semiconductor layer includes a current injection layer in which a proportion of aluminum decreases in a direction away from the active layer, the first electrode is disposed on the second sub semiconductor layer, the second electrode is disposed on the current injection layer, and a ratio of an average value of the proportion of aluminum of the second sub semiconductor layer to an average value of a proportion of aluminum of the current injection layer ranges from 1:0.12 to 1:1.6.

Advantageous Effects

According to the embodiment, output of light can be increased by improving ohmic properties.

Various useful advantages and effects of the present invention are not limited to the above-described advantages, and can be easily understood in a process in which specific embodiments are described.

MODES OF THE INVENTION

Embodiments of the present invention may be modified into different forms or the plurality of embodiments may be combined, and the scope of the present invention is not limited to the embodiments which will be described below.

Although a description given in a specific embodiment is not given in other embodiments, the description may be understood to be descriptions of other embodiments as long as there are no opposite or inconsistent descriptions given.

For example, when a feature of an element A is described in a specific embodiment and a feature of an element B is described in another embodiment, the scope of the present invention includes an embodiment in which the elements A and B are combined even when the embodiment is not clearly described as long as there are no opposite or inconsistent descriptions given.

In a description of the embodiment, in a case in which any one element is described as being formed on or under another element, such a description includes both a case in which the two elements are formed to be in direct contact with each other and a case in which the two elements are in indirect contact with each other such that one or more other elements are interposed between the two elements. In addition, in a case in which one element is described as being formed on or under another element, such a description may include a case in which one element is formed at an upper side or a lower side with respect to another element.

Hereinafter, embodiments of the present invention will be described in detail with reference to the accompanying drawings so that those skilled in the art may easily perform the present invention.

A light-emitting structure according to an embodiment of the present invention may emit light in an ultraviolet wavelength band. For example, the light-emitting structure may also emit light in a near ultraviolet wavelength band (UV-A), light in a far ultraviolet wavelength band (UV-B), or light in a deep ultraviolet wavelength band (UV-C). A wavelength range may be determined by a proportion of Al of the light-emitting structure 120.

For example, the light in the UV-A may have a wavelength ranging from 320 nm to 420 nm, the light in the UV-B may have a wavelength ranging from 280 nm to 320 nm, and the light in the UV-C may have a wavelength ranging from 100 nm to 280 nm.

Figure 1:
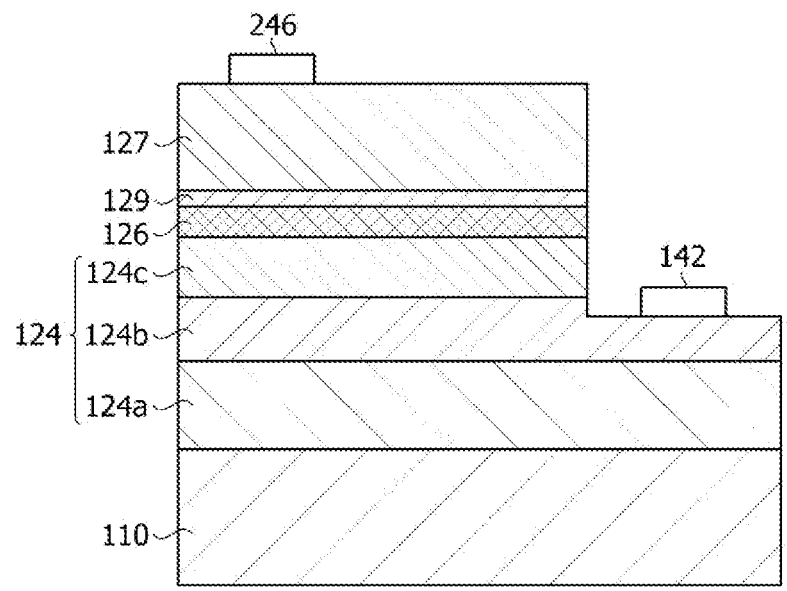
FIG. 1 is a conceptual view illustrating a semiconductor device according to one embodiment of the present invention.
Figure 2:
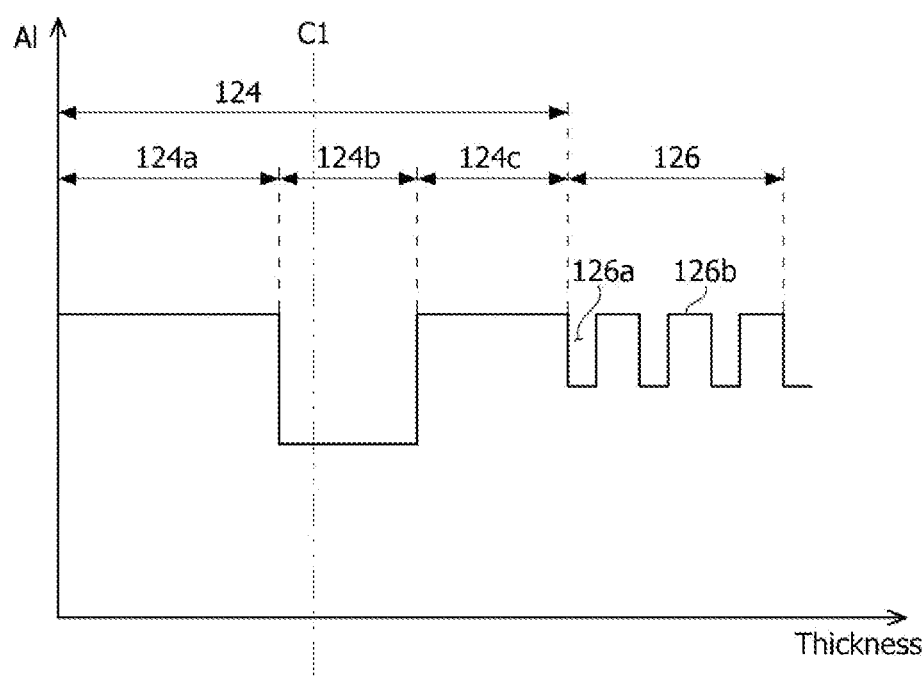
FIG. 2 is a view showing a proportion of aluminum in a semiconductor device according to a first embodiment of the present invention.
Figure 3:
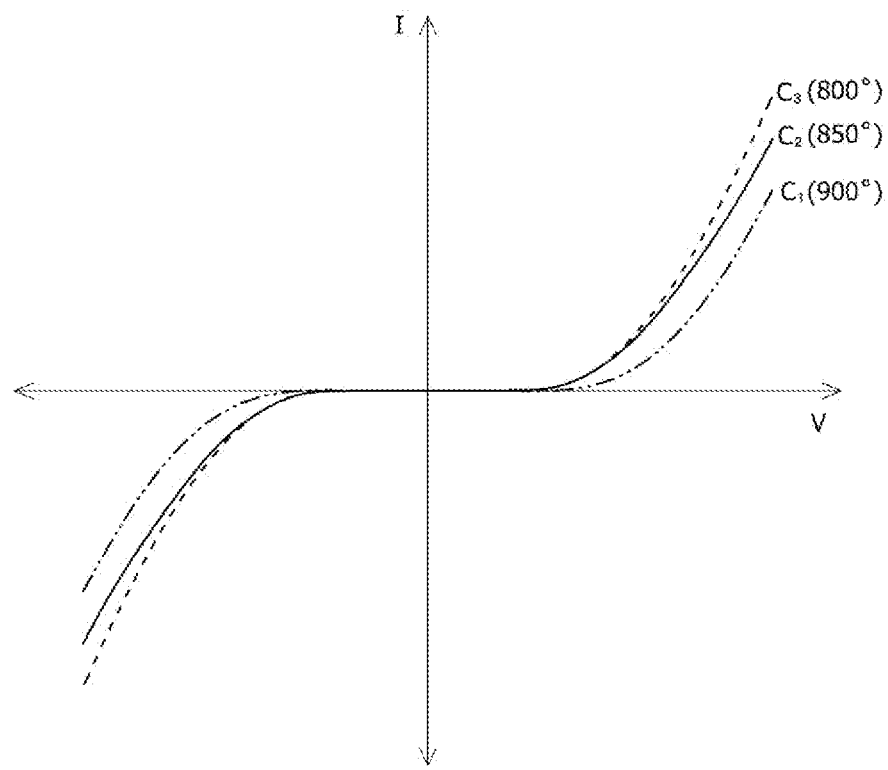
FIG. 3 is a graph showing a change in an ohmic property according to an increase in temperature.
Figure 4:
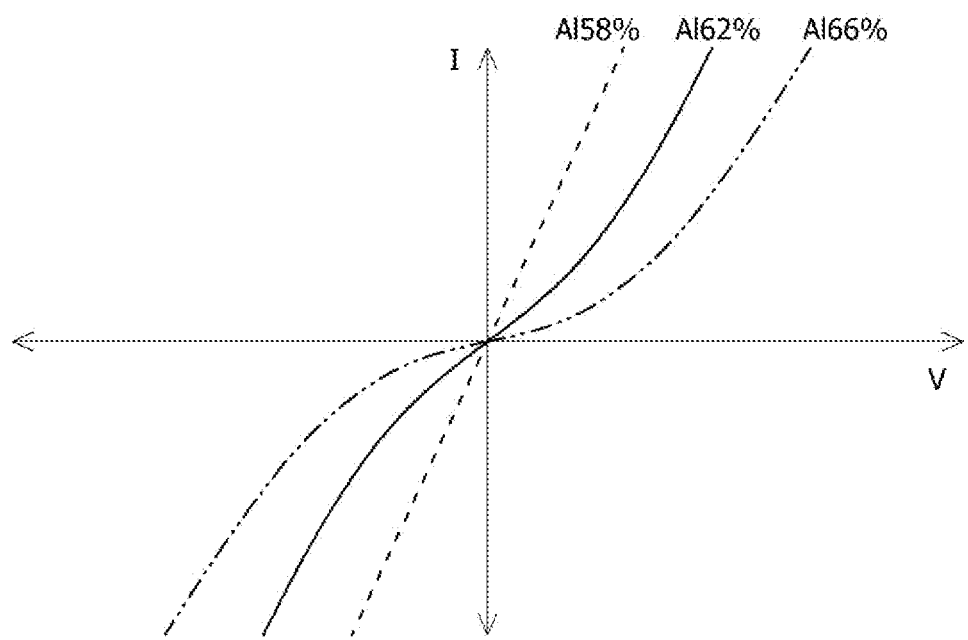
FIG. 4 is a graph showing a change in the ohmic property according to a change in a proportion of aluminum.
Figure 5:
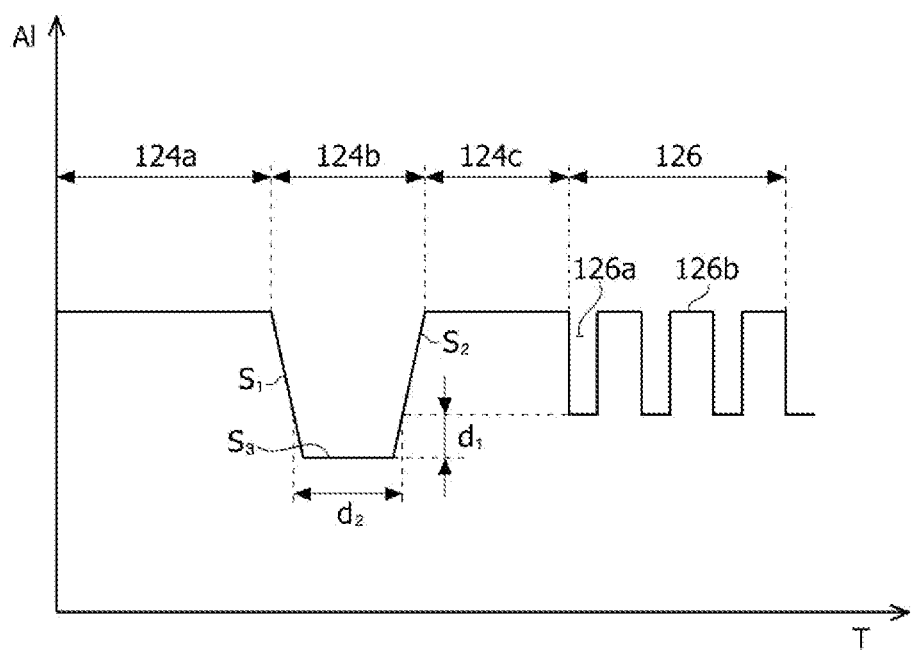
FIG. 5 is a view showing a proportion of aluminum in a semiconductor device according to a second embodiment of the present invention.

FIG. 1 is a conceptual view illustrating a semiconductor device according to one embodiment of the present invention, FIG. 2 is a view showing a proportion of aluminum in a semiconductor device according to a first embodiment of the present invention, FIG. 3 is a graph showing a change in an ohmic property according to an increase in temperature, FIG. 4 is a graph showing a change in the ohmic property according to a change in a proportion of aluminum, and FIG. 5 is a view showing a proportion of aluminum in a semiconductor device according to a second embodiment of the present invention.

Referring to FIGS. 1 and 2, the semiconductor device according to the embodiment includes a first conductive semiconductor layer 124, a second conductive semiconductor layer 127, and an active layer 126 disposed between the first conductive semiconductor layer 124 and the second conductive semiconductor layer 127.

The first conductive semiconductor layer 124 may be formed of a III-V or II-VI compound semiconductor or the like and may be doped with a first dopant. The first conductive semiconductor layer 124 may be selected from among semiconductor materials having a composition formula of $In_{x1}Al_{y1}Ga_{1-x1-y1}N$ ($0 \leq x1 \leq 1$, $0 < y1 \leq 1$, $0 \leq x1+y1 \leq 1$), for example, GaN, AlGaN, InGaN, and InAlGaN. In addition, the first dopant may be an N-type dopant such as Si, Ge, Sn, Se, and Te. In a case in which the first dopant is the N-type dopant, the first conductive semiconductor layer 124 doped with the first dopant may be an N-type semiconductor layer.

The active layer 126 may be disposed between the first conductive semiconductor layer 124 and the second conductive semiconductor layer 127. The active layer 126 is a layer in which electrons (or holes) injected through the first conductive semiconductor layer 124 meet holes (or electrons) injected through the second conductive semiconductor layer 127. As the electrons and the holes are recombined and transitioned to a low energy level, the active layer 126 may generate light in an ultraviolet wavelength.

The active layer 126 may include a well layer 126a and a barrier layer 126b and have one structure among a single well structure, a multi well structure, a single quantum well structure, a multi quantum well (MQW) structure, a quantum dot structure, and a quantum line structure, but the structure of the active layer 126 is not limited thereto.

The second conductive semiconductor layer 127 is formed on the active layer 126 and may be formed of a III-V or II-VI compound semiconductor, and the second conductive semiconductor layer 127 may be doped with a second dopant. The second conductive semiconductor layer 127 may be formed of a semiconductor material having a composition formula of $In_{x5}Al_{y2}Ga_{1-x5-y2}N$ ($0 \leq x5 \leq 1$, $0 < y2 \leq 1$, $0 \leq x5+y2 \leq 1$) or a material selected from among AlInN, AlGaAs, GaP, GaAs, GaAsP, and AlGaInP. In a case in which the second dopant is a P-type dopant such as Mg, Zn, Ca, Sr, and Ba, the second conductive semiconductor layer 127 doped with the second dopant may be a P-type semiconductor layer.

A first electrode 142 and a second electrode 246 may be ohmic electrodes or pad electrodes. Each of the first electrode 142 and the second electrode 246 may be formed to include at least one among indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO Nitride (IZON), Al—Ga ZnO (AGZO), In—Ga ZnO (IGZO), ZnO, IrOx, RuOx, NiO, RuOx/ITO, Ni/IrOx/Au or Ni/IrOx/Au/ITO, Ag, Ni, Cr, Ti, Al, Rh, Pd, Ir, Sn, In, Ru, Mg, Zn, Pt, Au, and Hf, but is not limited such a material.

The first conductive semiconductor layer 124 may include a first sub semiconductor layer 124a, a third sub semiconductor layer 124c, and a second sub semiconductor layer 124b disposed between the first sub semiconductor layer 124a and the third sub semiconductor layer 124c. The above layers may be distinguished by a proportion of aluminum.

A proportion of aluminum in each of the first sub semiconductor layer 124a and the third sub semiconductor layer 124c may be greater than a proportion of aluminum in the active layer 126. For example, the proportion of aluminum in the first sub semiconductor layer 124a may range from 50% to 90%, and the proportion of aluminum in the third sub semiconductor layer 124c may range from 50% to 90%. The proportion of aluminum in the first sub semiconductor layer 124a may also be equal to or different from the proportion of aluminum in the third sub semiconductor layer 124c.

A proportion of aluminum in the second sub semiconductor layer 124b may be less than the proportion of aluminum in each of the first sub semiconductor layer 124a and the third sub semiconductor layer 124c. The proportion of aluminum in the second sub semiconductor layer 124b may range from 30% to 79%. The first electrode 142 may be in contact with a layer in which a proportion of aluminum is relatively low in the first conductive semiconductor layer 124 to improve ohmic properties. Accordingly, the first electrode 142 may be in contact with the second sub semiconductor layer 124b. When the first electrode 142 is in contact with the second sub semiconductor layer 124b, electrical properties of the semiconductor device can be secured.

The proportion of aluminum in the active layer 126 may be relatively high to generate light having a wavelength of 230 nm or 255 nm. For example, a proportion of aluminum in the well layer 126a may be 75% or more. In this case, the proportion of aluminum in each of the first sub semiconductor layer 124a and the third sub semiconductor layer 124c may range from 80% to 90%, and the proportion of aluminum in the second sub semiconductor layer 124b may range from 60% to 79%. However, the proportion of aluminum in the well layer 126a may be adjusted according to a desired output wavelength.

Referring to FIGS. 3 and 4, it can be seen that a current-voltage (I-V) characteristic is improved as a temperature increases as illustrated in FIG. 3 or a proportion of aluminum decreases as illustrated in FIG. 4. Accordingly, it can be seen that electrical properties between the first conductive semiconductor layer 124 and the first electrode 142 are improved. This may be caused by the ohmic properties between the first conductive semiconductor layer 124 and the first electrode being improved according to a change in a temperature or proportion of aluminum. It can be seen that the change in a proportion of aluminum is more effective to improve the ohmic properties than the change in a temperature. Accordingly, it can be seen that it is advantageous to lower a proportion of aluminum in a region in which the first electrode 142 is disposed to improve the ohmic properties of the first conductive semiconductor layer 124. According to the embodiment, since the proportion of aluminum in the second sub semiconductor layer 124b is relatively low, the ohmic properties can be improved.

Referring to FIG. 2 again, a thickness of the first sub semiconductor layer 124a may range from 800 nm to 1500 nm, and a thickness of the third sub semiconductor layer 124c may range from 100 nm to 300 nm. A thickness of the second sub semiconductor layer 124b may range from 100 nm to 400 nm. In a case in which the thickness of the second sub semiconductor layer 124b is less than 100 nm, since the thickness is too small, it may be difficult to expose the second sub semiconductor layer 124b by etching. In addition, in a case in which the thickness is greater than 400 nm, since an average proportion of aluminum in the first conductive semiconductor layer 124 is lowered, defects may occur in the active layer 126.

A ratio of a total thickness of the first conductive semiconductor layer 124 to the thickness of the second sub semiconductor layer 124b may range from 1:0.05 to 1:0.4. Accordingly, the second sub semiconductor layer 124b may be disposed close to the active layer 126 on the basis of a median height C1 of the total thickness of the first conductive semiconductor layer 124. When the thickness ratio is greater than 1:0.05, a current diffusion property of the second sub semiconductor layer 124b may be improved, and when the thickness ratio is less than 1:0.4, a problem may be reduced in which a stress between the second sub semiconductor layer 124b and the first sub semiconductor layer 124a and a stress between the second sub semiconductor layer 124b and the third sub semiconductor layer 124c increase due to differences in proportion of aluminum.

Referring to FIG. 5, a second sub semiconductor layer 124b may include, according to a proportion of aluminum, a first section S1 in which a proportion of aluminum decreases in a thickness direction, a second section S2 in which a proportion of aluminum increases in the thickness direction, and an intermediate section S3 in which a proportion of aluminum has a lowest peak. For example, the proportion of aluminum in the second sub semiconductor layer 124b may decrease in a direction away from a first sub semiconductor layer 124a and the proportion of aluminum may increase in a predetermined section.

An average proportion of aluminum in the second sub semiconductor layer 124b may range from 30% to 79%. In a case in which the average proportion of aluminum in the second sub semiconductor layer 124b is less than 30%, a lattice defect may occur in an active layer disposed thereon, and in a case in which the average proportion is greater than 79%, ohmic properties may be degraded.

A proportion of aluminum in a partial region of the second sub semiconductor layer 124b may be less than a proportion of aluminum in a well layer 126a. That is, the second sub semiconductor layer 124b may also absorb light emitted from the well layer 126a. Accordingly, there may be a complementary relationship between optical properties and electrical properties of the semiconductor device, and the present invention may have a structure which improves electrical properties within a range in which optical properties are slightly degraded. For example, in a case in which the proportion of aluminum in the well layer 126a is 75% or less, an absorption region d1 may be defined as a region in which a proportion of aluminum is less than 75%. A thickness d2 of the absorption region of the second sub semiconductor layer 124b may be 100 nm or less. In a case in which the thickness of the absorption region is greater than 100 nm, a quantity of absorbed light increases, and thus light output may decrease.

Figure 6:
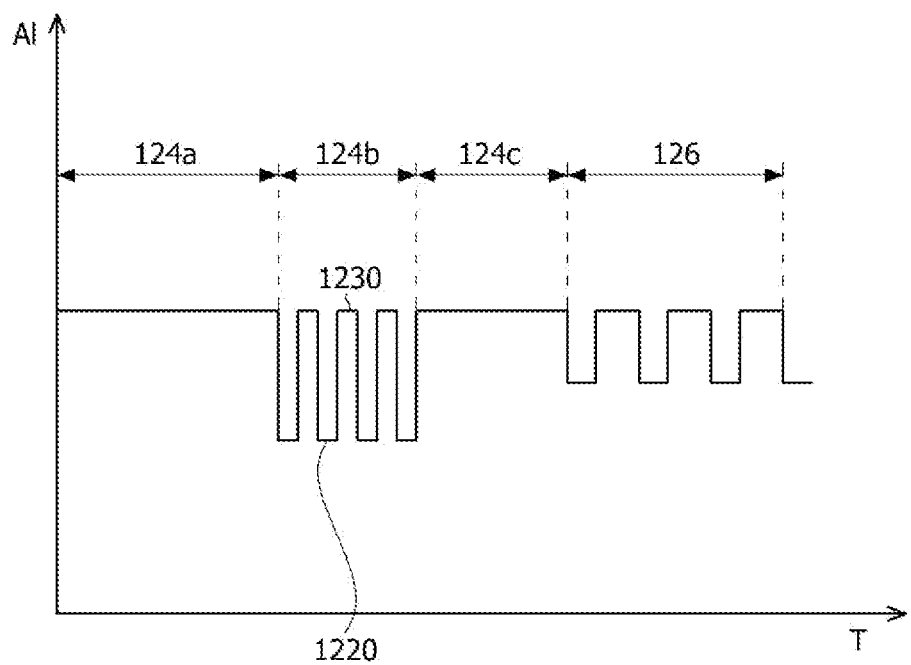
FIG. 6 is a view showing a proportion of aluminum in a semiconductor device according to a third embodiment of the present invention.
Figure 7:
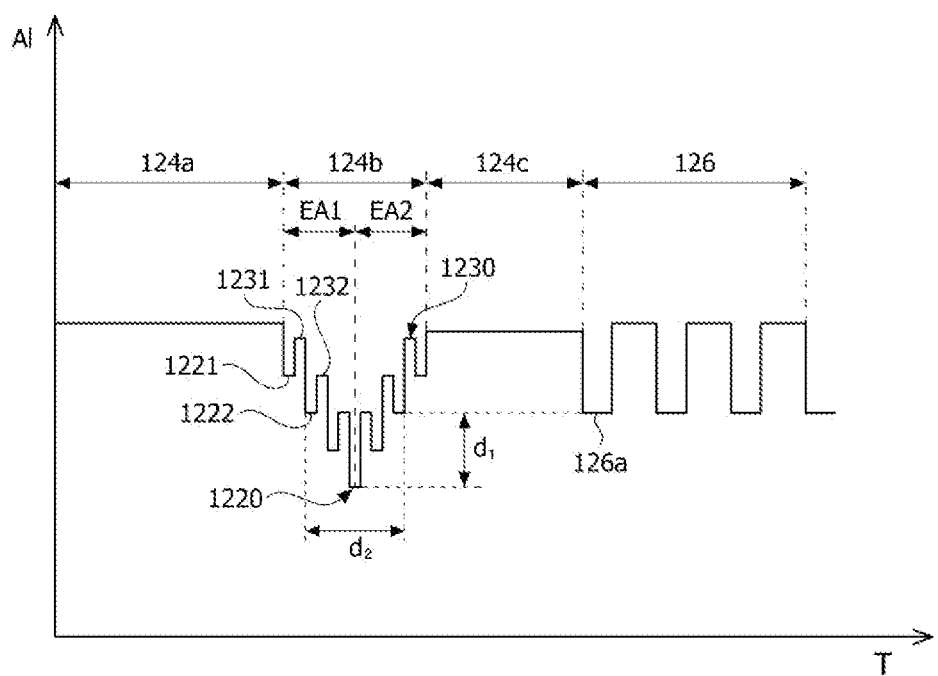
FIG. 7 is a view showing a proportion of aluminum in a semiconductor device according to a fourth embodiment of the present invention.

FIG. 6 is a view showing a proportion of aluminum in a semiconductor device according to a third embodiment of the present invention, and FIG. 7 is a view showing a proportion of aluminum in a semiconductor device according to a fourth embodiment of the present invention.

Referring to FIG. 6, a second sub semiconductor layer 124b may include first lattice layers 1220 and second lattice layers 1230 of which proportions of aluminum are different. A thickness of each of the first lattice layers 1220 and the second lattice layers 1230 is not specifically limited. A thickness of a lattice layer may be determined to have a value in which a total thickness of the second sub semiconductor layer 124b is divided by n.

For example, a thickness of each of the first and second lattice layers 1220 and 1230 may range from 1 nm to 10 nm. When the thickness of each of the first lattice layers 1220 and second lattice layers 1230 is greater than 1 nm, one layer may be formed. In addition, when the thickness is less than 10 nm, a function of a superlattice is improved to reduce a stress between a first sub semiconductor layer 124a and a third sub semiconductor layer 124c. In addition, a current diffusion property of the second sub semiconductor layer 124b can be improved.

A proportion of aluminum in the first lattice layer 1220 may be less than a proportion of aluminum in a second lattice layer 1230. The proportions of aluminum and the numbers of the first lattice layers 1220 and the second lattice layers 1230 may be suitably adjusted to achieve desired proportions of aluminum. For example, the proportion of aluminum in the first lattice layer 1220 may range from 30% to 70%, and the proportion of aluminum in the second lattice layer 1230 may range from 40% to 88%. In a case in which the above-described proportion range is met, an ohmic resistance can decrease, and a light absorption rate can also decrease.

In a case in which a first electrode 142 is in contact with the first lattice layer 1220, electrical properties may be high when compared to a case in which the first electrode 142 is in contact with the second lattice layer 1230. However, since the thickness of the first lattice layer 1220 is too small, it may be difficult to secure a process margin in an etching process in which the first electrode 142 is disposed. Accordingly, the first electrode 142 may also be in contact with the second lattice layer 1230.

Referring to FIG. 7, each of first lattice layers 1220 and second lattice layers 1230 may include a first section EA1 in which a proportion of aluminum decreases and a second section EA2 in which a proportion of aluminum increases in a thickness direction. For example, in a case in which a proportion of aluminum in an nth first lattice layer 1221 which is closest to a first sub semiconductor layer 124a is 70% and a proportion of aluminum in an nth second lattice layer 1231 is 88%, a proportion of aluminum in an (n+1)th first lattice layer 1222 may be 68%, and a proportion of aluminum in an (n+1)th second lattice layer 1232 may be 86%.

That is, in the first section EA1, the proportion of aluminum in the first lattice layer 1220 and the proportion of aluminum in the second lattice layer 1230 may gradually decrease, and in the second section EA2, the proportion of aluminum in the first lattice layer 1220 and the proportion of aluminum in the second lattice layer 1230 may gradually increase.

In an absorption region d1, the proportion of aluminum in each of the first lattice layer 1220 and the second lattice layer 1230 may be less than a proportion of aluminum in a well layer 126a. Accordingly, a second sub semiconductor layer 124b may also absorb light emitted from the well layer 126a. For example, in a case in which the proportion of aluminum in the well layer 126a is 75% or less, the absorption region d1 may be defined as a region in which a proportion of aluminum is less than 75%. A thickness d2 of the absorption region d1 of the second sub semiconductor layer 124b may be 100 nm or less. In a case in which the thickness d2 of the absorption region is greater than 100 nm, a quantity of absorbed light increases, and thus light output may decrease.

An average proportion of aluminum in the second sub semiconductor layer 124b may range from 30% to 79%. In a case in which the average proportion of aluminum in the second sub semiconductor layer 124b is less than 30%, a lattice defect may occur in an active layer disposed thereon, and in a case in which the average proportion is greater than 79%, ohmic properties may be degraded.

The average proportion of aluminum in the second sub semiconductor layer 124b may be less than that of each of the first sub semiconductor layer 124a and a third sub semiconductor layer 124c. In addition, the proportion of aluminum in the third sub semiconductor layer 124c may be less than that of the first sub semiconductor layer 124a.

Figure 8:
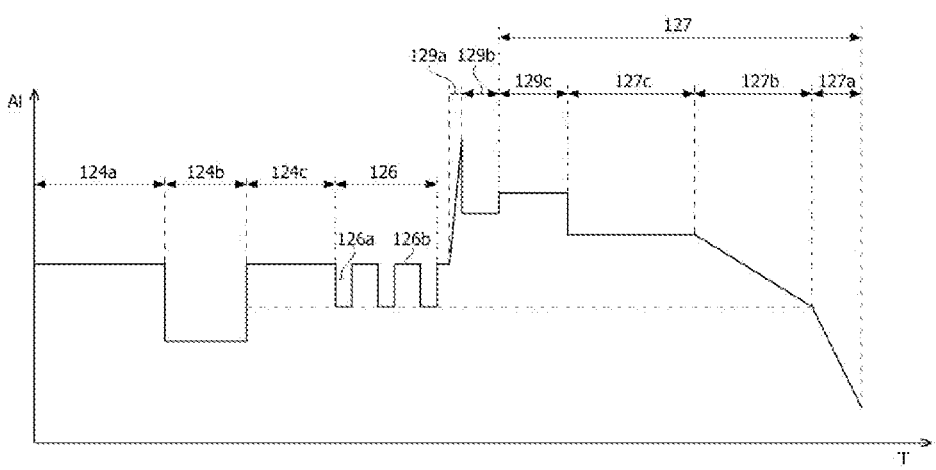
FIG. 8 is a view showing a proportion of aluminum in a semiconductor device according to a fifth embodiment of the present invention.

FIG. 8 is a view showing a proportion of aluminum in a semiconductor device according to a fifth embodiment of the present invention.

Referring to FIG. 8, a proportion of aluminum in a first conductive semiconductor layer 124 may have any proportion illustrated in FIGS. 2, 5, 6, and 7. For example, the proportions of aluminum in FIG. 2 are illustrated in FIG. 8. Hereinafter, the remaining layers will be described in detail below.

A proportion of aluminum in an electron blocking layer 129 may range from 50% to 100%. In a case in which the proportion of aluminum in the electron blocking layer 129 is less than 50%, there may be problems in that a height of an energy barrier for blocking electrons may be insufficient and the electron blocking layer 129 absorbs light emitted from an active layer 126.

The electron blocking layer 129 may include a first blocking layer 129a and a second blocking layer 129c. The electron blocking layer 129 may include a second dopant. The second dopant may include a P-type dopant such as Mg, Zn, Ca, Sr, or Ba. In a case in which the electron blocking layer 129 includes the second dopant, the electron blocking layer 129 may include a dopant which is the same as that of a second conductive semiconductor layer 127. However, the electron blocking layer 129 is not limited thereto and may have a polarity which is the same as that of the second conductive semiconductor layer 127. In addition, the electron blocking layer 129 may include a second dopant which is different from that of the second conductive semiconductor layer 127.

Carrier injection efficiency may increase and a resistance may decrease due to the first blocking layer 129a and the second blocking layer 129c, and thus an operating voltage Vf can decrease. A proportion of aluminum in the first blocking layer 129a may increase in a direction toward the second conductive semiconductor layer 127. The proportion of aluminum in the first blocking layer 129a may range from 80% to 100%. That is, the first blocking layer 129a may be AlGaN or AlN. In addition, the first blocking layer 129a may also be a superlattice layer in which AlGaN and AlN are alternately disposed.

A thickness of the first blocking layer 129a may range from about 0.1 nm to 4 nm. In a case in which the thickness of the first blocking layer 129a is less than 0.1 nm, there may be a problem in that movement of electrons is not efficiently blocked. In addition, in a case in which the thickness of the first blocking layer 129a is greater than 4 nm, hole injection efficiency into the active layer 126 may decrease.

A third blocking layer 129b undoped with Mg may be disposed between the first blocking layer 129a and the second blocking layer 129c. The third blocking layer 129b may serve to prevent a dopant from diffusing from the second conductive semiconductor layer 127 into the active layer 126. However, the third blocking layer 129b is not limited thereto, and a dopant of the second blocking layer 129c may diffuse into the third blocking layer 129b, and accordingly, the third blocking layer 129b may include the dopant.

The second conductive semiconductor layer 127 may include fourth to sixth sub semiconductors 127a, 127b, and 127c. The fourth sub semiconductor layer 127a and the fifth sub semiconductor 127b may be current injection layers, and the sixth sub semiconductor 127c may be a current diffusion layer. The current injection layers 127a and 127b may be defined as sections in which a proportion of aluminum decreases in a direction away from the active layer 126.

A thickness of the fifth sub semiconductor 127b may be between 10 nm and 50 nm. For example, the thickness of the fifth sub semiconductor 127b may be 25 nm. In a case in which the thickness of the fifth sub semiconductor 127b is less than 10 nm, a resistance increases in a horizontal direction, and thus current injection efficiency may decrease. In addition, the thickness of the fifth sub semiconductor 127b is greater than 50 nm, a resistance increases in a vertical direction, and thus current injection efficiency may decrease.

A proportion of aluminum in the fifth sub semiconductor 127b may be greater than a proportion of aluminum in a well layer 126a. In a case in which the proportion of aluminum in the well layer 126a is about 75%, the proportion of aluminum in the fifth sub semiconductor 127b may be greater than 75% so as to generate ultraviolet light having a wavelength of 230 nm.

In a case in which the proportion of aluminum in the fifth sub semiconductor 127b is less than the proportion of aluminum in the well layer 126a, since the fifth sub semiconductor 127b absorbs light, light extraction efficiency may decrease. Accordingly, the proportion of aluminum in the fifth sub semiconductor 127b may be greater than the proportion of aluminum in the well layer 126a.

A proportion of aluminum in the fourth sub semiconductor layer 127a may be less than the proportion of aluminum in the well layer 126a. That is, a thickness of the fourth sub semiconductor layer 127a may be defined as a thickness of a region in which a proportion of aluminum is less than that of the well layer 126a. In a case in which the proportion of aluminum in the fourth sub semiconductor layer 127a is greater than the proportion of aluminum in the well layer 126a, since a resistance between the second conductive semiconductor layer 127 and a second electrode increases, there are problems in that a sufficient ohmic contact does not occur and current injection efficiency decreases. Accordingly, by controlling the thickness of the fourth sub semiconductor layer 127a, electrical properties of the semiconductor device can be improved in a range in which optical properties of the semiconductor device are slightly degraded.

The proportion of aluminum in the fourth sub semiconductor layer 127a may be between 1% and 75%. In a case in which the proportion of aluminum is greater than 75%, a sufficient ohmic contact may not occur between the second conductive semiconductor layer 127 and the second electrode, and in a case in which the proportion of aluminum is less than 1%, since the proportion of aluminum is close to that of GaN, there is a problem in that the second conductive semiconductor layer 127 absorbs light.

The thickness of the fourth sub semiconductor layer 127a may range from 1 nm to 30 nm or from 1 nm to 10 nm. As described above, since the proportion of aluminum in the fourth sub semiconductor layer 127a is low for an ohmic contact, the second conductive semiconductor layer 127 may absorb ultraviolet light. Accordingly, it may be advantageous to control the thickness of the fourth sub semiconductor layer 127a to be minimal from a viewpoint of light output.

However, in a case in which the thickness of the fourth sub semiconductor layer 127a is controlled to be 1 nm or less, since the proportion of aluminum is sharply changed, crystallinity may be degraded. In addition, since the thickness of the fourth sub semiconductor layer 127a is too small, a surface resistance increases, and electrical properties of the semiconductor device may be degraded. In addition, in a case in which the thickness is greater than 30 nm, since a quantity of light absorbed by the fourth sub semiconductor layer 127a is too large, light output efficiency may decrease.

The thickness of the fourth sub semiconductor layer 127a may be less than the thickness of the fifth sub semiconductor 127b. A thickness ratio of the fifth sub semiconductor 127b to the fourth sub semiconductor layer 127a may range from 1.5:1 to 20:1. In a case in which the thickness ratio is less than 1.5:1, since the thickness of the fifth sub semiconductor 127b is too small, current injection efficiency may decrease. In addition, in a case in which the thickness ration is greater than 20:1, since the thickness of the fourth sub semiconductor layer 127a is too small, ohmic reliability may be degraded.

The proportion of aluminum in the fifth sub semiconductor 127b may decrease in the direction away from the active layer 126. In addition, the proportion of aluminum in the fourth sub semiconductor layer 127a may decrease in the direction away from the active layer 126.

Here, a decreasing rate of aluminum in the fourth sub semiconductor layer 127a may be greater than a decreasing rate of aluminum in the fifth sub semiconductor 127b. That is, a change rate of the proportion of Al in the fourth sub semiconductor layer 127a in a thickness direction may be greater than a change rate of the proportion of Al in the fifth sub semiconductor 127b in the thickness direction.

In the fifth sub semiconductor 127b, since the thickness should be greater than that of the fourth sub semiconductor layer 127a, and the proportion of aluminum therein should be greater than that of the well layer 126a, the decreasing rate may be relatively small. However, in the fourth sub semiconductor layer 127a, since the thickness is small, and the change rate of the proportion of aluminum is high, a decreasing rate of the proportion of aluminum may be relatively large.

The sixth sub semiconductor 127c may have a constant proportion of aluminum. A thickness of the sixth sub semiconductor 127c may range from 20 nm to 60 nm. The proportion of aluminum in the sixth sub semiconductor 127c may be greater than that of the active layer 126.

As described above, the thickness of the fourth sub semiconductor layer 127a may range from 1 nm to 10 nm, the thickness of the fifth sub semiconductor 127b may range 10 nm to 50 nm, and the thickness of the sixth sub semiconductor 127c may range from 20 nm to 60 nm. Accordingly, a thickness ratio of a total thickness of the second conductive semiconductor layer 127 to the thickness of the fourth sub semiconductor layer 127a may range from 1:0.008 to 1:0.3.

A second electrode 246 may be in contact with the current injection layers 127a and 127b. The average value of the proportion of aluminum in each of the current injection layers 127a and 127b may range from 10% to 50%. A quantity of absorbed light emitted from the active layer may decrease when the average proportion is greater than 10%, a resistance between the second electrode 246 and the current injection layers may decrease when the average proportion is less than 50%, and thus electrical properties of the semiconductor device can be improved.

However, an average value of the proportion of aluminum in the second sub semiconductor layer 124b may range from 30% to 79%. In a case in which the average proportion of aluminum in the second sub semiconductor layer 124b is less than 30%, a lattice defect may occur in the active layer disposed thereon, and in a case in which the average proportion is greater than 79%, ohmic properties may be degraded.

Accordingly, a ratio of the proportion of aluminum in the second sub semiconductor layer 124b to the proportion of aluminum in each of the current injection layers 127a and 127b may range from 1:0.12 to 1:1.6. In a case in which the semiconductor device emits ultraviolet light, a ratio of the proportions of aluminum may be in the range which balances a current due to a first dopant injected into the semiconductor device and a current due to a second dopant injected thereinto.

When the ratio of the proportions is between 1:0.12 and 1:1.6 and the semiconductor device operates, electrons and holes injected into the active layer are balanced, and thus electrical and optical properties of the semiconductor device can be improved.

Here, the average proportion of aluminum in the second sub semiconductor layer 124b may be greater than that of the fourth sub semiconductor layer 127a. Since the fourth sub semiconductor layer 127a is a surface of a light-emitting structure in contact with a P-type electrode, the proportion of aluminum may be controlled to be minimal to control ohmic properties. However, since the active layer 126 and the like are disposed on the second sub semiconductor layer 124b, in a case in which the proportion of aluminum in the second sub semiconductor layer 124b is controlled to be less than that of the fourth sub semiconductor layer 127a, crystalline quality may be degraded.

Figure 9:
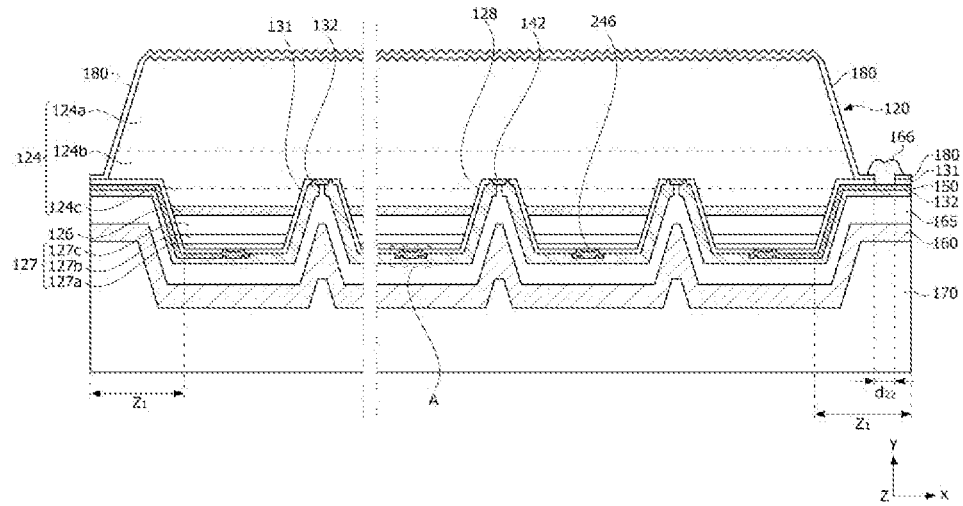
FIG. 9 is a conceptual view illustrating a semiconductor device according to another embodiment of the present invention
Figure 11A:
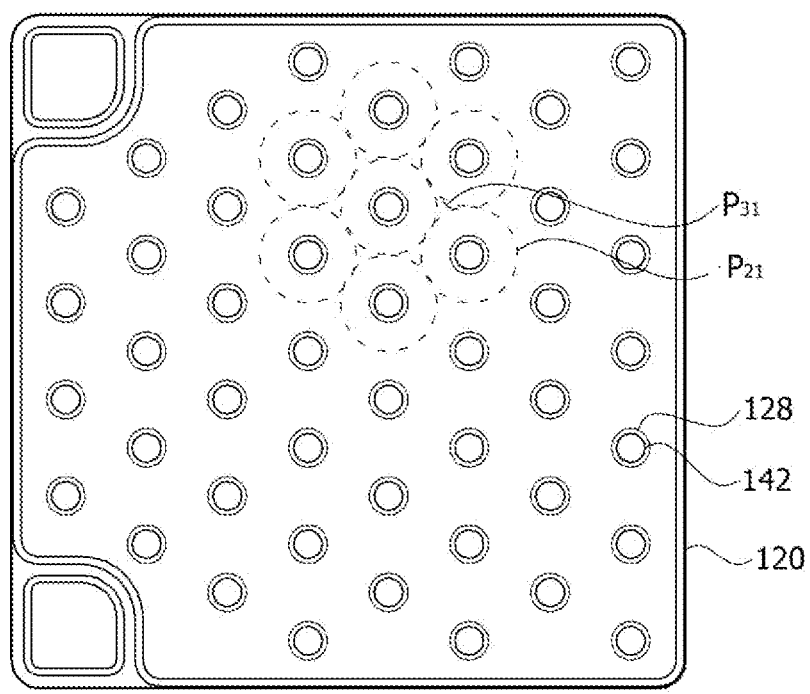
FIGS. 11A and 11B are plan views illustrating a semiconductor device according to an embodiment of the present invention.
Figure 11B:
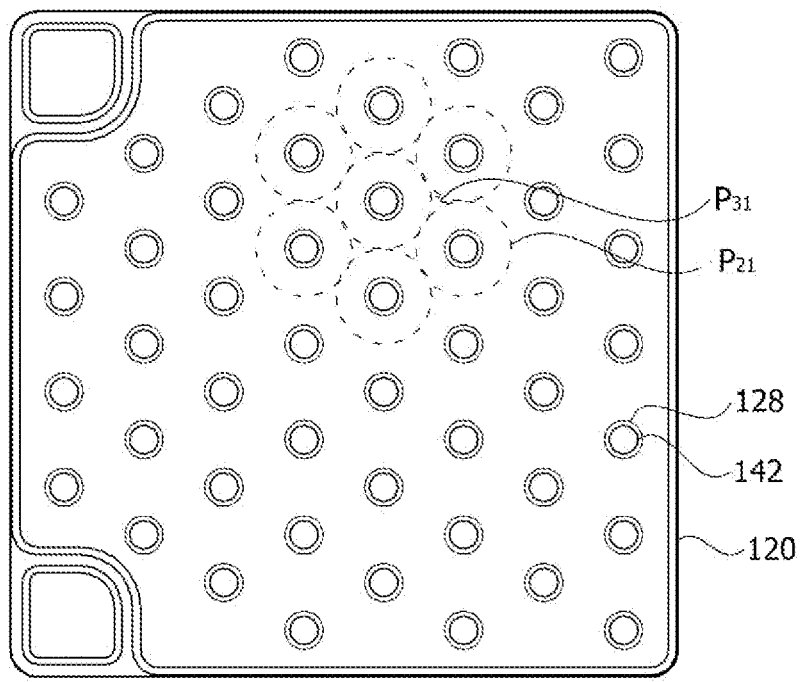

FIG. 9 is a conceptual view illustrating a semiconductor device according to another embodiment of the present invention, and FIGS. 11A and 11B are plan views illustrating a semiconductor according to an embodiment of the present invention.

Referring to FIG. 9, the configuration of the above-described light-emitting structure 120 may be applied to a light-emitting structure 120 without change. A plurality of recesses 128 may be disposed to pass thorough a second conductive semiconductor layer 127 and an active layer 126 to a partial region of a first conductive semiconductor layer 124.

A thickness of a second sub semiconductor layer 124b may range from 100 nm to 400 nm. In a case in which the thickness of the second sub semiconductor layer 124b is less than 100 nm, since the thickness is too small, it may be difficult for the recesses 128 to be disposed in the second sub semiconductor layer 124b. In addition, in a case in which the thickness is greater than 400 nm, since a light absorption rate of the second sub semiconductor layer 124b increases, there is a problem in that light output decreases.

First electrodes 142 may be disposed on upper surfaces of the recesses 128 and electrically connected to the first conductive semiconductor layer 124.

The first electrodes 142 may be electrically connected to the second sub semiconductor layer 124b of the first conductive semiconductor layer 124. A proportion of aluminum of the second sub semiconductor layer 124b may be lowest in the first conductive semiconductor layer 124. Accordingly, the first electrodes 142 may easily be in ohmic-contact with the second sub semiconductor layer 124b.

As another embodiment, upper surfaces of first electrodes 142 may be disposed above upper surfaces of recesses 128 in the recesses 128.

During a process, in a case in which the first electrodes 142 are disposed in sub recesses (not shown) after the sub recesses (not shown) are disposed in the recesses 128, the upper surfaces of the first electrodes 142 may be disposed to be higher than the upper surfaces of the recess 128, and upper surfaces of the sub recesses (not shown) may be disposed to be higher than the upper surfaces of the recesses 128.

Second electrodes 246 may be formed under the second conductive semiconductor layer 127.

The second electrodes 246 may be in contact with and electrically connected to a fourth sub semiconductor layer 127a.

Since an average proportion of aluminum in a current injection layer in contact with the second electrodes 246 ranges from 10% to 50%, an ohmic contact may easily occur therebetween. In addition, since a thickness of the fourth sub semiconductor layer 127a is between 1 nm and 30 nm, a quantity of absorbed light can be small.

The first electrodes 142 and the second electrodes 246 may be ohmic electrodes. Each of the first electrodes 142 and the second electrodes 246 may be formed to include at least one among indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO Nitride (IZON), Al—Ga ZnO (AGZO), In—Ga ZnO (IGZO), ZnO, IrOx, RuOx, NiO, RuOx/ITO, Ni/IrOx/Au or Ni/IrOx/Au/ITO, Ag, Ni, Cr, Ti, Al, Rh, Pd, Ir, Sn, In, Ru, Mg, Zn, Pt, Au, and Hf, but is not limited such a material.

A second electrode pad 166 may be disposed in one side corner region of the semiconductor device. Since a central portion of the second electrode pad 166 is recessed, an upper surface thereof may have a concave portion and a convex portion. A wire (not shown) may be bonded to the concave portion of the upper surface. Accordingly, since a bonding area increases, the second electrode pad 166 and the wire are more firmly bonded to each other.

Since the second electrode pad 166 may serve to reflect light, when the second electrode pad 166 is closer to the light-emitting structure 120, light extraction efficiency can increase.

A height of the convex portion of the second electrode pad 166 may be greater than that of the active layer 126. Accordingly, the second electrode pad 166 may reflect light emitted from the active layer 126 in a horizontal direction of the element to increase light extraction efficiency and control an orientation angle.

A part of a first insulating layer 131 is open under the second electrode pad 166 so that the second conductive layer 150 may be electrically connected to the second electrodes 246. A passivation layer 180 may be formed on an upper surface and a side surface of the light-emitting structure 120.

The passivation layer 180 may be in contact with the first insulating layer 131 at regions adjacent to the second electrodes 246 or under the second electrodes 246.

A width d22 of a portion in which the first insulating layer 131 is open so that the second electrodes 246 is in contact with the second conductive layer 150 may range, for example, from 40 μm to 90 μm. When the width d22 is less than 40 μm, there is a problem of increasing an operating voltage, and when the width d22 is greater than 90 μm, it may be difficult to secure a process margin for preventing the second conductive layer 150 from being exposed to the outside. When the second conductive layer 150 is exposed to outer regions of the second electrodes 246, reliability of the device may be degraded. Accordingly, the width d22 may range from 60% to 95% of a total width of the second electrode pad 166.

The first insulating layer 131 may electrically insulate the first electrodes 142 from the active layer 126 and the second conductive semiconductor layer 127. In addition, the first insulating layer 131 may electrically insulate the second electrodes 246 and the second conductive layer 150 from the first conductive layer 165.

The first insulating layer 131 may be formed of at least one selected from the group consisting of SiO2, SixOy, Si3N4, SixNy, SiOxNy, Al$_2$O$_3$, TiO2, AlN, and the like but is not limited thereto. The first insulating layer 131 may be formed to have a single layer or a plurality of layers. For example, the first insulating layer 131 may be a distributed Bragg reflector (DBR) having a multilayer structure including Si oxide or a Ti compound. However, the first insulating layer 131 is not necessarily limited thereto, and the first insulating layer 131 may include various reflective structures.

In a case in which the first insulating layer 131 performs an insulating function, the first insulating layer 131 may reflect light upward, which is emitted from the active layer 126 toward a side surface thereof, to increase light extraction efficiency. In an ultraviolet semiconductor device, as the number of recesses 128 increases, light extraction efficiency may become more effective as described below.

The second conductive layer 150 may cover the second electrodes 246. Accordingly, one electrical channel may be formed through the second electrode pad 166, the second conductive layer 150, and the second electrodes 246.

The second conductive layer 150 may completely surround the second electrodes 246 and be in contact with the side surface and an upper surface of the first insulating layer 131. The second conductive layer 150 may be formed of a material which has a high adhesive force to the first insulating layer 131 and may be formed of at least one material selected from the group consisting of Cr, Al, Ti, Ni, and Au or an alloy thereof and may be formed to have a single layer or a plurality of layers.

In a case in which the second conductive layer 150 is in contact with the side surface and the upper surface of the first insulating layer 131, thermal and electrical reliability of the second electrodes 246 may be improved. In addition, the second conductive layer 150 may have a reflective function of reflecting light upward which is emitted between the first insulating layer 131 and the second electrodes 246.

The second conductive layer 150 may be disposed at a second separation distance which is a region in which the second conductive semiconductor layer is exposed between the first insulating layer 131 and each of the second electrodes 246. The second conductive layer 150 may be in contact with a side surface and an upper surface of the second electrode 246 and the side surface and the upper surface of the first insulating layer 131 at the second separation distance.

In addition, a region, in which the second conductive layer 150 is in contact with the second conductive semiconductor layer 127 so that a Schottky junction is formed, may be disposed within the second separation distance, and since the Schottky junction is formed, a current may be easily distributed.

A second insulating layer 132 may electrically insulate the second electrodes 246 and the second conductive layer 150 from the first conductive layer 165. The first conductive layer 165 may pass through the second insulating layer 132 and may be electrically connected to the first electrodes 142.

The first conductive layer 165 and a bonding layer 160 may be disposed along a lower surface of the light-emitting structure 120 and a shape of the recesses 128. The first conductive layer 165 may be formed of a material with a high reflectivity. For example, the first conductive layer 165 may include aluminum. In a case in which the first conductive layer 165 includes aluminum, the first conductive layer 165 may serve to reflect light upward which is emitted from the active layer 126 so as to increase light extraction efficiency.

The bonding layer 160 may include a conductive material. For example, the bonding layer 160 may include a material selected from the group consisting of gold, tin, indium, aluminum, silicon, silver, nickel, and copper, or an alloy thereof.

A substrate 170 may be formed of a conductive material. For example, the substrate 170 may include a metal or a semiconductor material. The substrate 170 may be a metal with a high electrical and/or thermal conductivity. In this case, heat generated when the semiconductor device operates may be rapidly transferred to the outside.

The substrate 170 may include a material selected from the group consisting of silicon, molybdenum, tungsten, copper, and aluminum or an alloy thereof.

Irregularities may be formed on an upper surface of the light-emitting structure 120. The irregularities may increase the extraction efficiency of light emitted from the light-emitting structure 120. An average height of the irregularities may be changed according to an ultraviolet wavelength, and in the case of UV-C, the height may range from 300 nm to 800 nm, and when the average height ranges from 500 nm to 600 nm, light extraction efficiency can increase.

Figure 10:
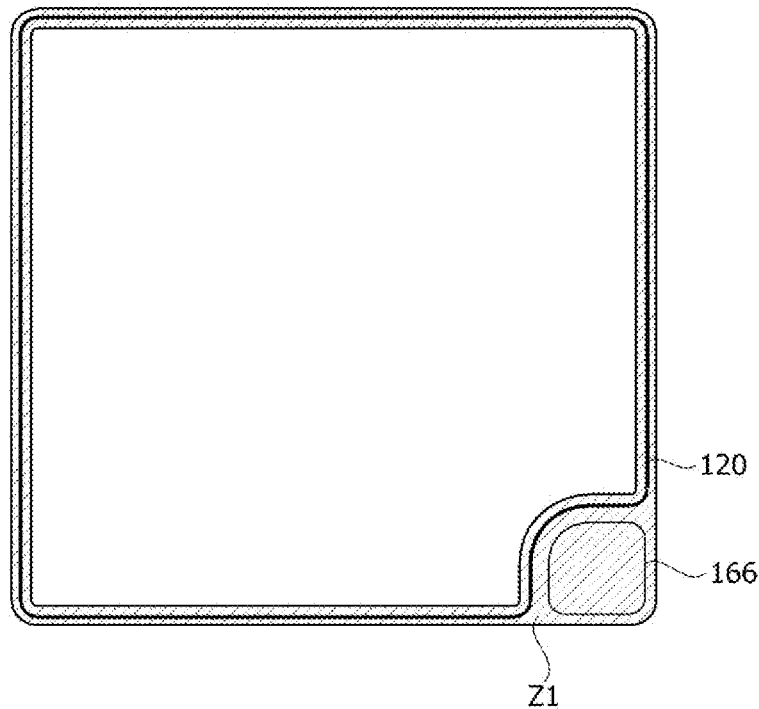
FIG. 10 is a plan view of FIG. 9.

The semiconductor device may include a side reflective portion Z1 disposed at an edge thereof. The second conductive layer 150, the first conductive layer 165, and the substrate 170 may protrude in a thickness direction (Y axis direction) to form the side reflective portion Z1. Referring to FIG. 10, the side reflective portion Z1 may be disposed along the edge of the semiconductor device to surround the light-emitting structure.

The second conductive layer 150 of the side reflective portion Z1 may protrude to be higher than the active layer 126 to reflect light L2 upward that is emitted from the active layer 126. Accordingly, although a separate reflective layer is not formed, light, which is emitted in a horizontal direction (X axis direction) due to a transverse magnetic (TM) mode, may be reflected upward by an outermost portion.

An inclination angle of the side reflective portion Z1 may be between 90° and 145°. The inclination angle may be an angle formed by the second conductive layer 150 and a horizontal surface (XZ plane). In a case in which the angle is less than 90° or greater than 145°, efficiency by which light moves toward a side surface is reflected upward may decrease.

The second electrodes 246 may be deposited to be formed on the fourth sub semiconductor layer 127a. In a case in which the second electrodes 246 are formed of a metal oxide such as ITO, the fourth sub semiconductor layer 127a may be in contact with oxygen. Accordingly, aluminum distributed on a surface of the fourth sub semiconductor layer 127a may react with the oxygen to form aluminum oxide. In addition, a nitride such as NO or an oxide such as Ga2O3 may also be further generated.

FIGS. 11A and 11B are plan views illustrating a semiconductor device according to an embodiment of the present invention.

When a proportion of Al increases in a light-emitting structure 120, a current diffusion property may be degraded in the light-emitting structure 120. In addition, a quantity of light emitted through a side surface of an active layer 126 increases when compared to a blue light-emitting device based on GaN (TM mode). Such a TM mode may occur in an ultraviolet semiconductor device.

According to the embodiment, a greater number of recesses 128 may be formed in a GaN semiconductor which emits light in a wavelength band of an ultraviolet region for diffusing a current when compared to the number of recesses 128 formed in a GaN semiconductor which emits blue light, and first electrodes 142 may be disposed thereon.

Referring to FIG. 11A, when a proportion of Al increases, the current distribution property may be degraded. Accordingly, a current is distributed at only points adjacent to the first electrodes 142, and a current density may decrease sharply at each of points which are farther away therefrom. Accordingly, effective light-emitting regions P21 may decrease in area. The effective light-emitting region P21 may be defined as a region having border points at which a current density is 40% or less of a current density of points adjacent to the first electrodes 142 having a highest current density. For example, the effective light-emitting region P21 may be adjusted according to a current injection level and a proportion of Al thereof within a distance ranging from 5 μm to 40 μm from each of centers of the recesses 128.

Particularly, a current density of each of low current density regions P31 between the first electrodes 142 which are adjacent to each other is almost too low to contribute to emitting light. Accordingly, in the embodiment, the first electrode 142 may be further disposed in the low current density region P31 in which the current density is low to increase light output.

Generally, since a GaN semiconductor layer has a relatively high current distribution property, areas of the recesses 128 and the first electrodes 142 may be minimized. This is because an area of the active layer 126 decreases as the areas of the recesses 128 and the first electrodes increase. However, in the case of the embodiment, since the proportion of Al is high, a current diffusion property degrades relatively, and thus an area of the current density region P31 may decrease by increasing the number of the first electrodes 142 even though the area of the active layer 126 is sacrificed.

Referring to FIG. 11B, in a case in which the number of recesses 128 is 48, the recesses 128 may not be disposed in straight lines in width and height directions but may be disposed in a zigzag manner. In this case, since the area of the low current density region P31 decreases further, most of the active layer may participate in light emission. In a case in which the number of recesses 128 ranges from 82 to 110, a current distributes more effectively, an operating voltage decreases further, and thus light output can increase. In a semiconductor device which emits UV-C, in a case in which the number of recesses 128 is less than 82, electrical and optical properties may be degraded, and when the number is greater than 110, electric properties may be improved, but optical properties may be degraded due to a decrease in volume of a light-emitting layer.

A first area in which the plurality of first electrodes are in contact with a first conductive semiconductor layer 122 may range from 7.4% to 20% or from 10% to 20% of a maximum horizontal cross-sectional area of a light-emitting structure 120. The first area may be the sum of areas in which the first electrodes 142 are in contact with the first conductive semiconductor layer 122.

In a case in which the first area of the first electrodes 142 is less than 7.4% thereof, since a current diffusion property may not be sufficient, light output decreases, and in a case in which the first area is greater than 20%, since the areas of the active layer and the second electrode decrease too much, there are problems in that an operating voltage increases and light output decreases.

In addition, a total area of the plurality of recesses 128 may range from 13% to 30% of a maximum horizontal cross-sectional area of the light-emitting structure 120. When the total area of the recesses 128 does not meet the condition, it is difficult to control a total area of the first electrodes 142 to range from 7.4% to 20%. In addition, there are problems in that an operating voltage increases and light output decreases.

A second area in which the second electrodes 246 are in contact with the second conductive semiconductor layer 127 may range from 35% to 70% of the maximum horizontal cross-sectional area of the light-emitting structure 120. The second area may be a total area in which the second electrodes 246 are in contact with the second conductive semiconductor layer 127.

In a case in which the second area is less than 35% thereof, since an area of the second electrodes decreases too much, there are problems in that an operation voltage increases, and second carrier (for example, hole) injection efficiency decreases. In a case in which the second area is greater than 70% thereof, since the first area may not be increased effectively, there is a problem in that first carrier (for example, electron) injection efficiency decreases.

The first area and the second area are inversely proportion to each other. That is, in a case in which the number of recesses increases to increase the number of the first electrodes, the area of the second electrodes decreases. Electron and hole distribution properties should be balanced to increase light output. Accordingly, it is important to define a suitable ratio of the first area and the second area.

A ratio (first-area:second-area) of the first area in which the plurality of first electrodes are in contact with the first conductive semiconductor layer to the second area in which the second electrodes are in contact with the second conductive semiconductor layer may range from 1:3 to 1:10.

In a case in which the area ratio is greater than 1:10, since the first area is relatively small, a current distribution property may be degraded. In addition, in a case in which the area ratio is less than 1:3, there is a problem in that the second area becomes relatively small.

Figure 12:
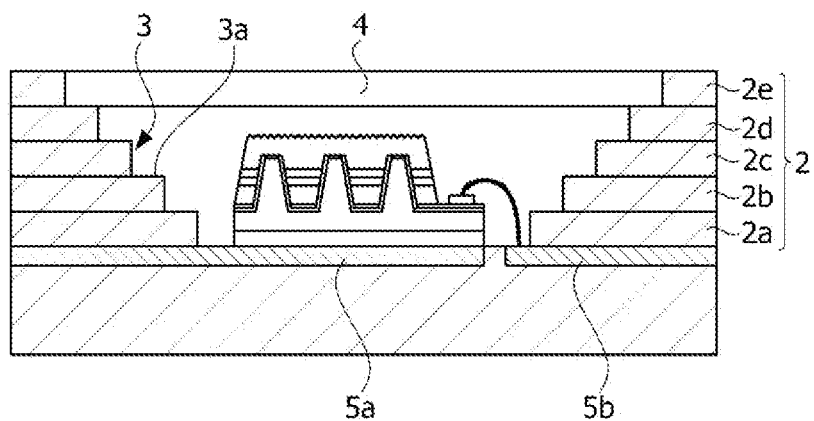
FIG. 12 is a conceptual view illustrating a semiconductor device package according to one embodiment of the present invention.

FIG. 12 is a conceptual view illustrating a semiconductor device package according to one embodiment of the present invention.

The semiconductor device may be formed as a package and used in a curing apparatus for a resin, a resist, spin on dielectric (SOD), or spin on glass (SOG). Alternatively, the semiconductor device may also be used in devices for therapy and medical purposes or electronic devices such as sterilizers used in an air cleaner, a water purifier, and the like.

Referring to FIG. 12, the semiconductor device package may include a body 2 in which a groove 3 is formed, a semiconductor device 1 disposed in the body 2, and a pair of lead frames 5a and 5b disposed in the body 2 and electrically connected to the semiconductor device 1. The semiconductor device 1 may include all of the above-described components.

The body 2 may include a material or a coating layer which reflects ultraviolet light. The body 2 may be formed by stacking a plurality of layers 2a, 2b, 2c, and 2d. The plurality of layers 2a, 2b, 2c, and 2d may be formed of one material or different materials.

The groove 3 is formed to be widened in a direction farther away from the semiconductor device, and a step 3a may be formed on an inclination surface.

A light transmission layer 4 may cover the groove 3. The light transmission layer 4 may be formed of a glass material but is not limited thereto. When a material is capable of effectively transmitting ultraviolet light, the material of the light transmission layer 4 is not particularly limited. An inside of the groove 3 may be an empty space.

The semiconductor device may be used as a light source of a lighting system, a light source of an image display apparatus, or a light source of a lighting device. That is, the semiconductor device may be disposed in a case and applied to various electronic devices which provide light. For example, in a case in which the semiconductor device and red, green, and blue (RGB) phosphors are mixed and used, white light with a high color rendering index (CRI) may be realized.

The above-described semiconductor device is formed as a light-emitting device package and may be used as a light source of a lighting system. For example, the semiconductor device may be used as a light source of an image display apparatus, a light source of a lighting device, or the like.

The semiconductor device may be used as an edge type backlight unit or a direct type backlight unit when used as a backlight unit of the image display apparatus, and the semiconductor device may be used in a lighting apparatus or as a bulb type lighting device when used as the light source of the lighting device. In addition, the semiconductor device may also be used as a light source of a mobile phone.

The light-emitting device includes a laser diode in addition to the above-described light-emitting diode.

The laser diode may include the first conductive semiconductor layer, the active layer, and the second conductive semiconductor layer of the above-described structure like the light-emitting device. In addition, the laser diode uses an electro-luminescence phenomenon in which light is emitted when a P-type first conductive semiconductor and an N-type second conductive semiconductor are bonded to each other and a current is applied thereto, but there are differences in orientation and phase of emitted light. That is, the laser diode may emit light having one specific wavelength (monochromatic beam) and one phase in one direction by using a stimulated emission phenomenon, a constructive interference, and the like and may be used for optical communication, medical equipment, semiconductor process equipment, and the like due to such features.

A photodetector, which is a kind of transducer configured to detect light and convert an intensity thereof to an electrical signal, may be an example of a light-receiving element. Such a photodetector includes a photocell (silicon or selenium), a light output pre-element (cadmium sulfide or cadmium selenide), a photodiode (for example, a photodiode having a peak wavelength in a visible blind spectral region or a true blind spectral region), a phototransistor, a photomultiplier tube, a photo-tube (vacuum or gas-filled), an infra-red (IR) detector, and the like but is not limited thereto.

In addition, the semiconductor device such as the photodetector may generally be manufactured using a direct bandgap semiconductor with a high photoconversion efficiency. Alternatively, the photodetector has various structures, and the most typical photodetector includes a p-type/insulator/n-type (PIN)-type photodetector using a p-n junction, a Schottky-type photodetector using a Schottky junction, a metal/semiconductor/metal (MSM)-type photodetector, and the like.

The photodiode may include the first conductive semiconductor layer, the active layer, and the second conductive semiconductor layer of the above-described structure like the light-emitting device and is formed to have a p-n junction or a PIN structure. The photodiode is operated by applying a reverse bias or a zero bias, and when light is incident on the photodiode, electrons and holes are generated so that a current flows. In this case, an amount of current is almost proportional to an intensity of the light incident on the photodiode.

The photocell or a solar cell is one kind of the photodiode and may include the first conductive semiconductor layer, the active layer, and the second conductive semiconductor layer of the above-described structure like the light-emitting device.

In addition, the semiconductor device may also be used as a rectifier of an electronic circuit using rectification characteristics of a general diode using a p-n junction and may be applied to an oscillation circuit by being applied to an ultrahigh frequency circuit.

In addition, the above-described semiconductor device is not necessarily formed of only a semiconductor and may further include a metal material in some cases. For example, the semiconductor device such as the light-receiving element may be formed of at least one among Ag, Al, Au, In, Ga, N, Zn, Se, P, and As and may also be formed of a semiconductor material doped with a P-type or N-type dopant or an intrinsic semiconductor material.

The embodiments have been particularly described but are only examples and do not limit the present invention. It will be understood by those skilled in the art that various changes and applications that are not illustrated above will be made within a range without departing from the essential characteristics of the present invention. For example, the components specifically described in the embodiments may be changed. In addition, it should be interpreted that differences related to the changes and applications fall within the scope of the present invention defined by the appended claims.

The invention claimed is:
1. A semiconductor device comprising:
a first conductive semiconductor layer;
a second conductive semiconductor layer;
an active layer disposed between the first conductive semiconductor layer and the second conductive semiconductor layer;
a first electrode electrically connected to the first conductive semiconductor layer; and
a second electrode electrically connected to the second conductive semiconductor layer, wherein the first conductive semiconductor layer includes
    a first sub semiconductor layer,
a third sub semiconductor layer, and
a second sub semiconductor layer disposed between the
    first sub semiconductor layer and the third sub semiconductor layer,
each of an average value of a proportion of aluminum in
    the first sub semiconductor layer and an average value
    of a proportion of aluminum in the third sub semiconductor layer is greater than an average value of a
    proportion of aluminum in the active layer,
an average value of a proportion of aluminum in the
    second sub semiconductor layer is less than each of the
    average value of the proportion of aluminum in the first
    sub semiconductor layer and the average value of the
    proportion of aluminum in the third sub semiconductor
    layer,
the second conductive semiconductor layer includes a
    current injection layer in which a proportion of aluminum decreases in a direction away from the active
    layer,
the first electrode is disposed on the second sub semiconductor layer,
the second electrode is disposed on the current injection
    layer, and
a ratio of the average value of the proportion of aluminum
    in the second sub semiconductor layer to an average
    value of the proportion of aluminum in the current
    injection layer ranges from 1:0.12 to 1:1.6.

2. The semiconductor device of claim 1, wherein a thickness of the second sub semiconductor layer ranges from 100 nm to 400 nm.

3. The semiconductor device of claim 1, wherein
    the second sub semiconductor layer includes a first section in which a proportion of aluminum decreases and
    a second section in which a proportion of aluminum
    increases in a thickness direction.

4. The semiconductor device of claim 1, wherein the second sub semiconductor layer includes a first lattice layer and a second lattice layer in which proportions of aluminum are different.

5. The semiconductor device of claim 1, wherein the current injection layer includes a fourth sub semiconductor layer on which the second electrode is disposed,
    wherein the fourth sub semiconductor layer is thinner than
        the second sub semiconductor layer.

6. The semiconductor device of claim 5, wherein:
    the current injection layer includes a fifth sub semiconductor disposed between the fourth sub semiconductor
        layer and the active layer; and
    each of a proportion of aluminum in the fourth sub
        semiconductor layer and a proportion of aluminum in
        the fifth sub semiconductor decreases in the direction
        away from the active layer.

7. The semiconductor device of claim 6, wherein a decreasing rate of aluminum in the fourth sub semiconductor layer is greater than a decreasing rate of aluminum in the fifth sub semiconductor.

8. The semiconductor device of claim 1, wherein the second sub semiconductor layer includes a section in which a proportion of aluminum is less than the proportion of aluminum in the active layer in a thickness direction.

9. The semiconductor device of claim 8, wherein a ratio of a total thickness of the first conductive semiconductor layer to a thickness of the second sub semiconductor layer ranges from 1:0.05 to 1:0.4.

* * * * *